(12) United States Patent
Song

(10) Patent No.: US 11,803,327 B2
(45) Date of Patent: Oct. 31, 2023

(54) POWER MANAGEMENT MECHANISM AND MEMORY DEVICE HAVING THE SAME

(71) Applicant: Yangtze Memory Technologies Co., Ltd., Wuhan (CN)

(72) Inventor: Daesik Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 207 days.

(21) Appl. No.: 17/328,085

(22) Filed: May 24, 2021

(65) Prior Publication Data

US 2022/0317929 A1 Oct. 6, 2022

Related U.S. Application Data

(63) Continuation of application No. PCT/CN2021/084451, filed on Mar. 31, 2021.

(51) Int. Cl.
*G06F 3/06* (2006.01)
(52) U.S. Cl.
CPC .......... *G06F 3/0659* (2013.01); *G06F 3/0625* (2013.01); *G06F 3/0688* (2013.01)
(58) Field of Classification Search
CPC ..... G06F 3/0659; G06F 3/0625; G06F 3/0688
See application file for complete search history.

(56) References Cited

U.S. PATENT DOCUMENTS

| | | | |
|---|---|---|---|
| 9,244,519 B1* | 1/2016 | Ellis | G06F 3/0634 |
| 2013/0301372 A1 | 11/2013 | Park et al. | |
| 2014/0029357 A1 | 1/2014 | Lee et al. | |
| 2014/0293704 A1 | 10/2014 | Ghalam et al. | |
| 2017/0242607 A1* | 8/2017 | Vishne | G06F 13/24 |
| 2020/0042238 A1* | 2/2020 | Jung | G06F 3/0679 |
| 2020/0210107 A1* | 7/2020 | Palmer | G06F 3/0656 |
| 2020/0350026 A1 | 11/2020 | Piccardi et al. | |
| 2022/0171546 A1* | 6/2022 | Yu | G06F 3/0659 |

OTHER PUBLICATIONS

Chang, Li-Pin, et al. "Current-aware flash scheduling for current capping in solid state disks." IEEE Transactions on Computer-Aided Design of Integrated Circuits and Systems 39.2 (2018): 321-334. (Year: 2018).*
The World Intellectual Property Organization (WIPO) International Search Report for PCT/CN2021/084451 dated Dec. 30, 2021 4 pages.

* cited by examiner

*Primary Examiner* — Nicholas J Simonetti
(74) *Attorney, Agent, or Firm* — ANOVA LAW GROUP, PLLC

(57) ABSTRACT

A method for a memory device having memory dies includes performing high power portions of array operations in the memory dies, ending the high power portions in the memory dies, generating a register signal after ending the high power portions, and in response to obtaining the register signal, commencing one or more input/output (I/O) operations in the memory dies.

20 Claims, 8 Drawing Sheets

POWER MANAGEMENT MECHANISM AND MEMORY DEVICE HAVING THE SAME

CROSS-REFERENCE TO RELATED APPLICATION

This application claims the priority to PCT Patent Application No. PCT/CN2021/084451 filed on Mar. 31, 2021, the entire content of which is incorporated herein by reference.

FIELD OF THE TECHNOLOGY

This application relates to the field of semiconductor technology and, specifically, to a three-dimensional (3D) memory device and a method of power management for memory devices.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Some memory devices contain multiple NAND memory dies. To avoid exceeding a power consumption threshold when multiple memory dies are operated in parallel, peak power management (PPM) can be performed. In some cases, array operations are suspended at each NAND memory die before entering high power portions of the array operations. Suspension of array operations can increase the total array operation time and cause performance degradation. The disclosed systems and methods are directed to solve one or more problems set forth above and other problems.

SUMMARY

In one aspect of the present disclosure, a method for a memory device having memory dies includes performing high power portions of array operations in the memory dies, ending the high power portions of the array operations in the memory dies, generating a register signal after ending the high power portions, and in response to obtaining the register signal, commencing one or more input/output (I/O) operations in the memory dies outside a time period of the high power portions performed in the memory dies.

In another aspect of the present disclosure, a method for a memory device having memory dies includes performing high power portions of array operations in the memory dies, and performing I/O operations in the memory dies. The high power portions of array operations are performed when the I/O operations are not executed. The I/O operations are performed when at least one of the high power portions of array operations is not executed.

In another aspect of the present disclosure, a memory device includes a controller and memory dies that each include one or more memory arrays. The controller is configured to generate a register signal when high power portions in the memory dies are ended, and in response to obtaining the register signal, commence one or more I/O operations in the memory dies outside a time period of the high power portions performed in the memory dies.

In another aspect of the present disclosure, a memory die is selected from multiple memory dies that are power managed together. The memory die includes one or more memory arrays, an I/O interface, a status register for storing a register signal, and a controller. The controller is configured to generate the register signal when high power portions in the multiple memory dies are ended, transmit the register signal to the status register after generating the register signal, and in response to obtaining the register signal, commence an I/O operation in the memory die outside a time period of the high power portions performed in the multiple memory dies.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
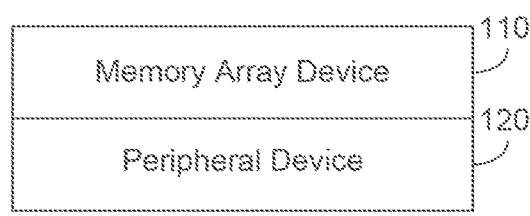
FIG. 1 illustrates a cross-sectional view of an exemplary three-dimensional (3D) memory device according to various embodiments of the present disclosure.

FIG. 1 schematically shows a cross-sectional view of an exemplary 3D memory device 100 according to embodiments of the present disclosure. The 3D memory device 100 may be a discrete memory device working individually. The 3D memory device 100 may also be a part of a memory structure that has multiple memory devices 100. The 3D memory device 100 may include a memory array device 110 and a peripheral device 120. The memory array device 110 may include memory cells that form one or more 3D arrays. The peripheral device 120 may include a circuitry as a controller to control operations of the 3D memory device 100. In some embodiments, the memory array device 110 and the peripheral device 120 may be fabricated separately and then bonded together to form a stack-like structure, as shown in FIG. 1. Alternatively, the memory array device 110 and the peripheral device 120 may be integrated into one device. For example, the peripheral device 120 may be fabricated first and then the memory array device 110 may be made over the peripheral device 120 and using the peripheral device 120 as a substrate. In some other embodiments, the memory array device 110 and the peripheral device 120 may be fabricated separated and then mounted side by side on a printed circuit board (PCB).

Figure 2:
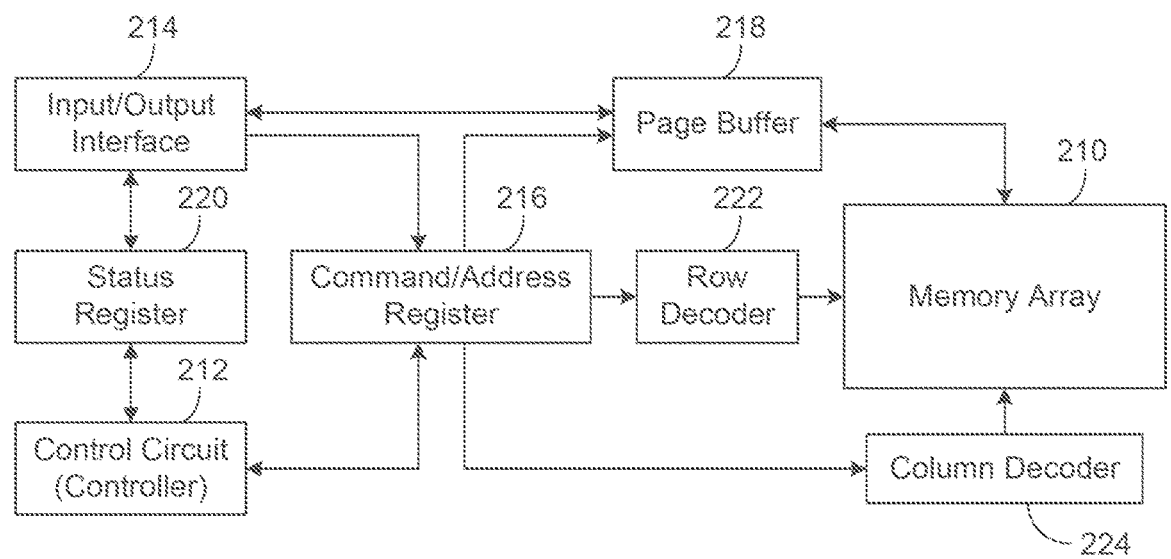
FIG. 2 illustrates a block diagram of a 3D memory device according to various embodiments of the present disclosure.

FIG. 2 shows a block diagram of a 3D memory device 200 according to embodiments of the present disclosure. The 3D memory device 200 may include a memory array 210 and a control circuit 212 that functions as a controller of the 3D memory device 200. The memory array 210 may include a 3D array of memory cells (not shown). The memory cells may include Not-AND (NAND) memory cells, Not-OR (NOR) memory cells, and/or memory cells of other types. Optionally, the memory array 210 may also include a two-dimensional (2D) array of memory cells (not shown) that contains NAND memory cells, NOR memory cells, and/or memory cells of other types. The 3D memory device 200 may further include an input/output (I/O) interface 214, a command/address register 216, a page buffer 218, a status register 220, a row decoder 222, and a column decoder 224. The control circuit 212 may be coupled with, e.g., the command/address register 216 and the status register 220, and implement various functions of the 3D memory device 200. For example, the control circuit 212 may perform read operations, write (or programming) operations, and erase operations. The term "coupled" as used herein indicates electrically coupled. The I/O interface 214, which may also be referred to as an I/O component or I/O connections, may contain an I/O circuit to receive an input of command signals, address signals, and data signals to the 3D memory device 200 and transmit data and status information from the 3D memory device 200 to another device (e.g., a host device/an external memory controller). The I/O interface 214 may be coupled with, for example, the command/address register 216, the page register 218, and the status register 220. The command/address register 216 may latch or temporarily store command signals and address signals and pass the command and address signals to the control circuit 212, the row decoder 222, and the column decoder 224, respectively. The page buffer 218 may include multiple page buffers that buffer or temporarily store data signals. The status register 220 may include multiple status registers that latch status information. For example, the status register 220 may store status information related to read operations, write operation, and erase operations that will be performed or is being performed. The status register 220 may also store status information that will be transmitted to another device (e.g., a host device) via the I/O interface 214. In some embodiments, the control circuit 212 may include the status register 220. That is, the status register 220 may be a part of the control circuit 212. The row decoder 222 and column decoder 224 may decode row and column address signals respectively for accessing the memory array 210. The row decoder 222 and column decoder 224 may also receive different voltages from a voltage generator circuit (not shown) and transfer the received voltages to selected objects, such as a word line or bit line of the memory array 210.

The I/O interface 214 may detect command signals, address signals, and data signals from the input. In some embodiments, the I/O interface 214 may transmit command and address signals to the command/address register 216, and transmit data signals to the pager buffer 218. The I/O interface 214 may also receive data signals from the page buffer 218 after the data signals are read from the memory array 210 and then transmit the data signals to another device (e.g., a host device/external memory controller). In some cases, the control circuit 212 may transmit the command, address, and data signals to the register 216 and the page buffer 218 respectively by sending instructions to the I/O interface 214.

For the 3D memory array 210, its memory cells may be configured in rows and columns. Memory cells of a row may be connected together by a conductive layer (e.g., a metal layer) of the 3D array. For example, the control gate of each memory cell of a row may be connected to the conductive layer. The conductive layer may be coupled to an access line (e.g., a word line). Memory cells of a column may be connected in series. For example, a drain of a memory cell may be connected to a source of an adjacent memory cell in a column. Memory cells of a column also form a string (such a string is also referred to as a "NAND string"). Each column of the 3D array may be selectively connected to a data line (e.g., a bit line). Memory cells of the 3D array may be written (or programmed) to one of two or more than two data states at write operations.

Logically, the 3D memory array 210 may include memory cells arranged in NAND targets, planes, blocks, and pages in some cases. For example, the 3D memory array 210 may include one or more NAND targets logically. A NAND target may contain one or more planes. A plane may contain one or more blocks. A block may contain multiple pages. A page, storing a number of bytes or words, may contain one or more rows of memory cells and is the smallest addressable unit for read and write operations. Alternatively, a NAND target may contain one or more logical units (LUNs). A LUN may contain one or more planes. In such cases, a LUN is the minimum unit that can execute commands and report status independently. At read and write operations, data may be read from or written to the 3D memory array 210 in pages. At erase operations, data may be erased in blocks, i.e., NAND memory cells in a block may be reset together at a block erase operation.

The control circuit 212 may control various array operations that include, for example, read operations, write operations, and erase operations. At an array operation, one or multiple memory cells are accessed at a time. When a memory cell is accessed, multiple access lines and multiple data lines may be charged to certain voltages, respectively. The charged access and data lines may be discharged after a memory cell is accessed and charged again when a subsequent memory cell is accessed. As an access process leads to a charging event that can generate a supply current peak, certain part or portion of an array operation may be considered as a high power portion. More specifically, the term "high power portion" as used herein indicates a portion of an array operation that has a peak current beyond a predetermined value over a peak current period of time. When array operations are performed in multiple memory dies, access processes are carried out concurrently and peak currents in the multiple dies can overlap along a timeline.

The overlapping peak currents can create power consumption beyond a maximum level and cause malfunction of a memory device.

Figure 3A:
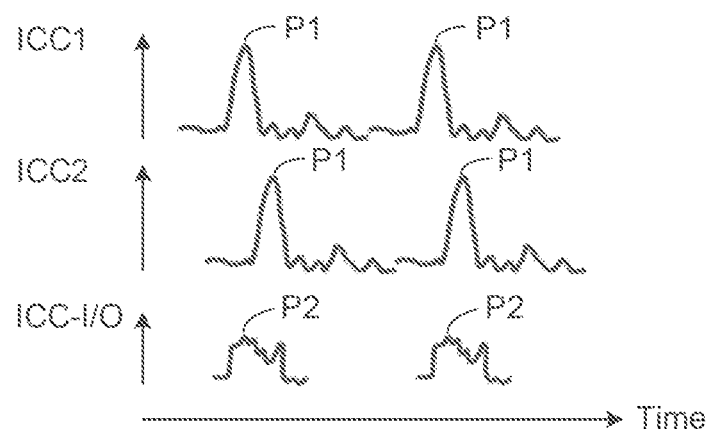
FIGS. 3A and 3B illustrate diagrams of peak currents in array operations and input/output (I/O) operations.
Figure 3B:
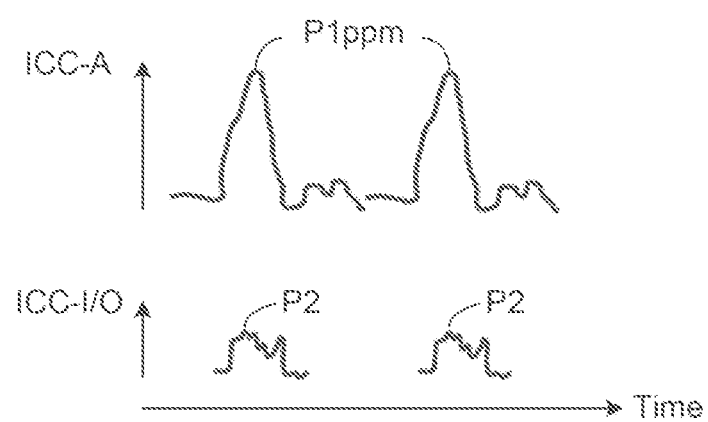

FIGS. 3A and 3B show diagrams of peak currents at array operations and I/O operations. Assuming that a memory device contains a first memory die with a first memory array and a first controller and a second memory die with a second memory array and a second controller. In some embodiments, the first memory array and the first controller may be disposed in the first memory die, and the second memory array and the second controller may be disposed in the second memory die. Alternatively, a memory array and a corresponding controller may be configured in different dies. The first and second controllers each have a control circuit that is similar to the control circuit 212 with respect to FIG. 2 and arranged for implementing operations in the first and second memory dies, respectively. ICC1 is the supply current at array operations in the first memory die. ICC2 is the supply current at array operations in the second memory die. ICC-I/O is the supply current at I/O operations in the first and second memory dies. P1 is a value of the peak current of ICC1. Assuming that P1 is also a value of the peak current of ICC2. P2 is a value of the peak current of ICC-I/O. The first and second controllers are in communication with each other. In some cases, one of the first and second controllers may control operations of the first and second memory dies.

As shown in FIG. 3A, the peak currents of ICC1 and ICC2 are separated by a time period such that they do not align along a timeline. Let ICC-A represent the addition of ICC1 and ICC2 after the peak currents of ICC1 and ICC2 are staggered using peak power management (PPM). ICC-A and ICC-I/O are illustrated in FIG. 3B. P1$ppm$ is a value of the peak current of ICC-A under the control of the PPM and is smaller than 2P1. As such, the total current of the memory device is arranged equal to or smaller than the addition of P1$ppm$ and P2. The PPM method as illustrated above makes the total current below a maximum level. However, before the high power portions of array operations in the first and second dies get started, array operations in the first and second dies have to be suspended for certain time. Thus, every time before the peak currents of ICC1 and ICC2 are staggered, the array operations of the first and second dies have to stop or pause for certain time. It may increase the total array operation time and degrade the performance of the memory device.

Figure 4A:
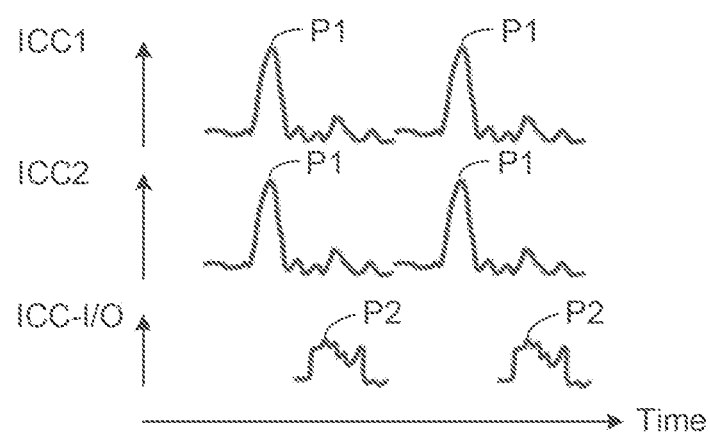
FIGS. 4A and 4B illustrate diagrams of peak currents in array operations and I/O operations according to various embodiments of the present disclosure.
Figure 4B:
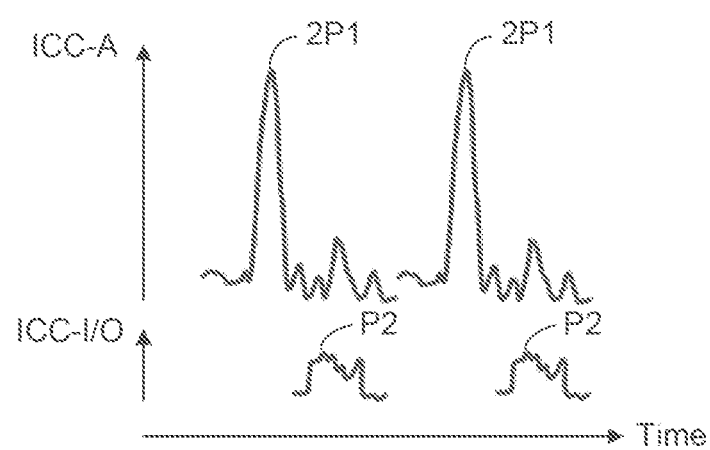

FIGS. 4A and 4B show diagrams of peak currents in array operations and I/O operations according to various embodiments of the present disclosure. Assuming that a memory device includes one or more first memory arrays and a first controller disposed in a first memory die and one or more second memory arrays and a second controller disposed in a second memory die. The first and second controllers each may have a control circuit that is similar to the control circuit 212 with respect to FIG. 2 and arranged for implementing operations in the first and second memory dies, respectively. ICC1 is the supply current at array operations in the first memory die. ICC2 is the supply current at array operations in the second memory die. ICC-I/O is the supply current at I/O operations in the first and second memory dies. Assuming that the value of the peak current of ICC1 is P1. The value of the peak current of ICC2 may be P1 or a different number. For descriptions below, P1 is the value of the peak current of ICC 1 and ICC2, respectively. Also assuming that P1 is larger than the predetermined value and thus the peak regions of ICC1 and ICC2 with peak current value P1 may be considered as high power portions of array operations of the memory device. P2 is a value of the peak current of ICC-I/O. The first and second controllers are in communication with each other. In some cases, one of the first and second controllers may control operations of the first and second memory dies. Optionally, the first and second controllers may control operations of the first and second memory dies, respectively. In some cases, an external controller, such as a controller of a host device, may control operations of the first and second memory dies. In descriptions below with respect to FIGS. 4A and 4B, a "controller" as used herein may represent any of the options described above.

As shown in FIG. 4A, the peak currents of ICC1 and ICC2 may be aligned along a timeline and the peak currents of ICC-I/O are separated by a time period from the high power portions of array operations of the memory device along the time line. Let ICC-A represent the addition of ICC1 and ICC2, after the peak currents of ICC1 and ICC2 are combined. ICC-A and ICC-I/O are illustrated in FIG. 4B. 2P1 is the value of the peak current of ICC-A when the peaks with peak current value P1 of ICC1 and ICC2 are aligned.

The scenario depicted in FIGS. 4A and 4B represents an extreme case, i.e., the alignment of the main current peaks of ICC1 and ICC2. As the current peaks of ICC-I/O are away from the high power portions along the timeline, the total current of the memory device may be arranged equal to or smaller than 2P1, which may represent an allowable current level for the memory device. Because the total current of the memory device is below the allowable level whether or not the current peaks of ICC1 and ICC2 are aligned or misaligned during array operations of the first and second dies, suspension of array operations is avoided. That is, suspension of array operations in the first and second dies is avoided before the high power portions of the array operations are started by the controller. It may reduce the total array operation time and improve the performance of the memory device.

The controller may control to perform I/O operations in the first memory die or in the second memory die to receive data signals from an external device (e.g., a host device/external memory controller) and pass the data signals to a page buffer. I/O operations may also be performed to send data signals read from the first and second memory dies to the external device. I/O operations may be considered as low power operations or low power events compared to the high power portions of array operations described above. As the current peaks of ICC-I/O are moved away from the high power portions of array operations, the power usage is distributed more evenly between the array operation and I/O operation, which may allow more peak power budget for the array operations.

In some embodiments, when the controller executes high power portions of array operations, I/O operations may not be performed. I/O operations may be performed when the high power portions are not executed. Optionally, I/O operations may be performed only when the high power portions are not executed. In addition, in some cases, the high power portions may be performed when I/O operations are not executed or only when I/O operations are not executed.

A flag register signal may be defined that makes the controller start I/O operations. For example, it may be arranged such that the controller does not commence one or more I/O operations unless receiving the flag register signal. The controller may generate and output the flag register signal after high power portions of array operations are ended. For example, the controller may implement array operations in the first and second memory dies. After the high power portions of array operations are completed, the controller may generate the flag register signal. In response to receiving the flag register signal, the controller may commence one or more I/O operations in the first and second memory dies within a preset time period. In some embodiments, the controller may send the flag register signal to a status register (e.g., the status register 220 with respect to FIG. 2). The status register may latch the flag register signal. Optionally, the controller may be configured to periodically read the status register and determine whether to continue the I/O operations or terminate the I/O operations. When the controller determines to continue the I/O operations, the controller may keep the flag register signal at the status register and perform the I/O operation continuously. When the controller determines to terminate the I/O operations, the controller may delete the flag register signal from the status register and end the I/O operations.

Figure 5:
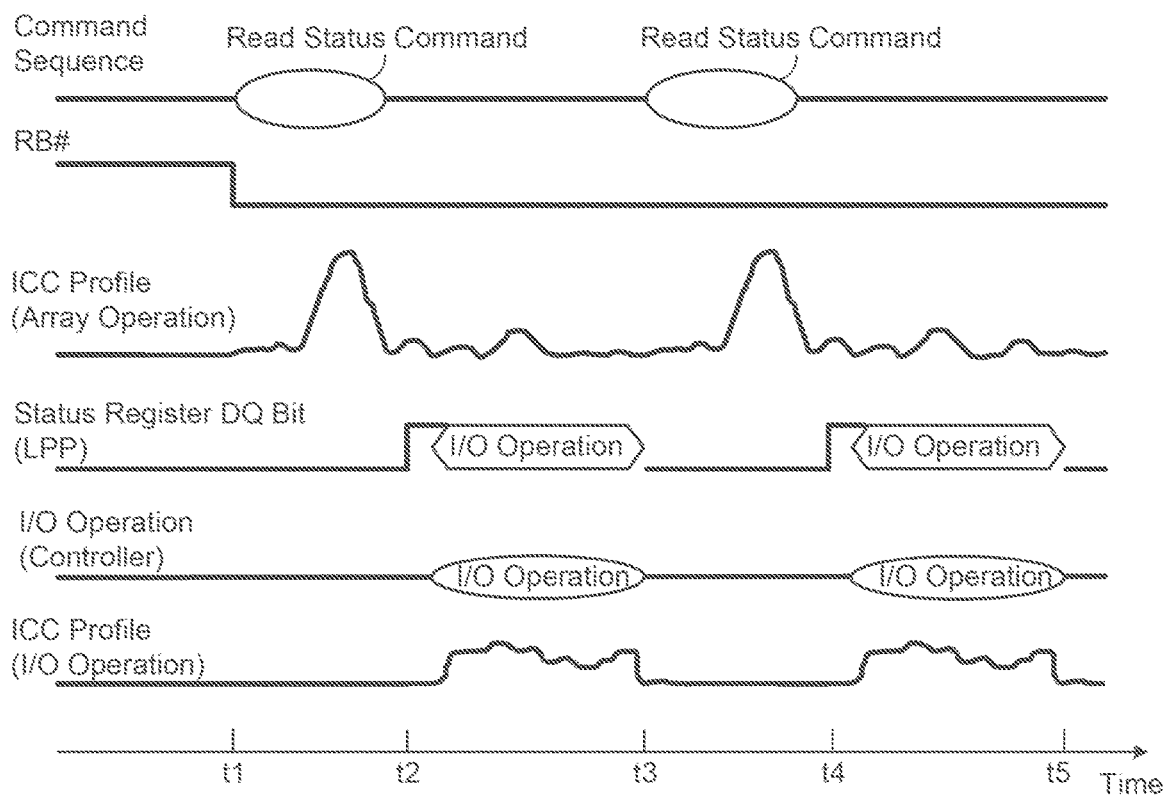
FIG. 5 illustrates a timing diagram of array and I/O operations of two dies according to various embodiments of the present disclosure.

FIG. 5 shows a timing diagram 500 of array and I/O operations of two dies according to various embodiments of the present disclosure. Assuming that a memory device includes a first memory die with one or more first memory arrays and a first controller and a second memory die with one or more second memory arrays and a second controller. The memory device may also include a status register (e.g., the status register 220 with respect to FIG. 2). The first and second controllers each may have a control circuit that is similar to the control circuit 212 with respect to FIG. 2 and arranged for implementing operations in the first and second memory dies, respectively. The first and second controllers are in communication with each other. In some cases, one of the first and second controllers may control operations of the first and second memory dies. Optionally, the first and second controllers may control operations of the first and second memory dies, respectively. Alternatively, an external controller, such as a controller of a host device, may control operations of the first and second memory dies. In descriptions below with respect to FIG. 5, a "controller" as used herein may represent any of the options described above.

Referring to FIG. 5, "Command Sequence" indicates one or more commands among commands executed by the controller along a timeline. RB# is Ready/Busy signal that indicates the target status. When R/B# is low, it indicates that one or more operations are in progress. The ICC profile (array operation) describes a supply current profile of array operations and reflects the addition of currents from array operations in the first and the second dies. The "Status Register DQ Bit" may be a value that indicates the status of the flag register signal. The I/O operation (controller) indicates one or more I/O operations among operations the controller executes. The ICC profile (I/O operation) describes a supply current profile of I/O operations and reflects the addition of currents from I/O operations in the first and the second dies.

In some embodiments, the memory device may be configured to separately control array operations and I/O operations of the first and second memory dies. At time t1, the R/B# becomes low, the controller may start implementing one or more commands, such as a read status command that causes the controller to read the status register. The controller may execute the read status command repeatedly with certain time interval. Assuming that the status register does not have the flag register signal. Then, the controller does not perform I/O operations in the first and second memory dies. The controller may commence array operations in the first and second memory dies and the array operations may enter high power portions.

Around time t2, the controller may end the high power portions of array operations and at the same time or within a given short time period output a flag register signal. In some embodiments, the controller may transmit the flag register signal to the status register. As such, the status register DQ bit may have a value that indicates that the flag register signal is active or enabled. Further, when the controller executes the read status command at the status register, the controller may read the status register DQ bit and obtain the flag register signal. The flag register signal may prompt the controller to commence I/O operations in the first and second memory dies within a given time period.

At time t3, the controller may end the I/O operations. In some cases, the controller may disable the flag register signal or delete the flag register signal from the status register after starting the I/O operations. Alternatively, the controller may disable the flag register signal or delete the flag register signal from the status register after terminating the I/O operations. In either scenarios, the flag register signals becomes disabled after the I/O operations come to an end at time t3. Thereafter, the controller may start high power portions of array operations again.

Around time t4, the controller may end the high power portions of array operations and at the same time or within a given short time period output a flag register signal. The controller may transmit the flag register signal to the status register. Then, the status register DQ bit may have a value that indicates that the flag register signal is active or enabled. Further, the controller may execute the read status command at the status register and read the status register DQ bit to obtain the flag register signal. The flag register signal may cause the controller to begin one or more I/O operations in the first and second memory dies within a given time period.

At time t5, the controller may end the I/O operations. Further, the controller may perform additional array operations. Because the high power portions of array operations and the I/O operations are configured in different time frames which do not overlap, the peak of the total current at array operations is equal to or smaller than the addition of the peak current of the array operation in the first memory die and the peak current of the array operation in the second memory die. The controller does not need to pause or stop array operations to avoid exceeding the maximum current level. As such, the performance of the memory device may be improved.

Figure 6:
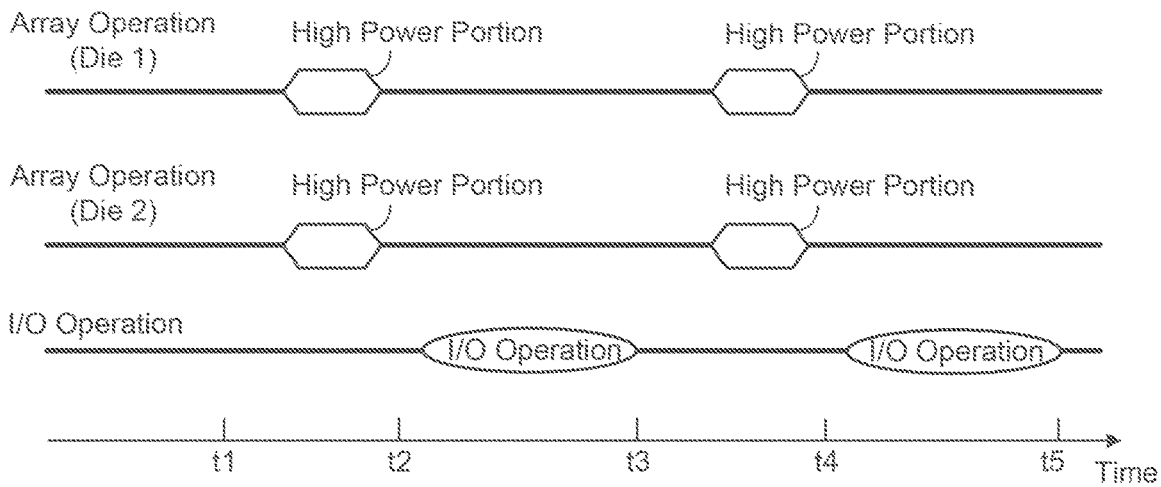
FIG. 6 illustrates a timing diagram of array and I/O operations of two dies according to various embodiments of the present disclosure.

FIG. 6 shows a timing diagram 600 of array and I/O operations of two dies according to various embodiments of the present disclosure. Assuming that a memory device includes a memory die (e.g., die 1) with a first memory array and a first controller and another memory die (e.g., die 2) with a second memory array and a second controller. The memory device may also include a status register (e.g., the status register 220 with respect to FIG. 2). The first and second controllers each may have a control circuit that is similar to the control circuit 212 with respect to FIG. 2 and arranged for implementing operations in die 1 and die 2, respectively. The first and second controllers are in communication with each other. In descriptions below with respect to FIG. 6, a "controller" as used herein may represent one of the first and second controllers or another controller of the memory device.

Optionally, it is arranged that the controller may separately control array operations and I/O operations of die 1 and die 2. At time t1, the controller may perform array operations in die 1 and die 2. The controller may implement high power portions of array operations in die 1 and die 2, respectively. The two high power portions of array operations may overlap entirely. In some cases, the two high power portions of array operations may overlap partially.

Around time t2, the controller may end the high power portions of array operations. After the high power portions are ended, the controller may output a flag register signal. Further, the controller may send the flag register signal to the status register. The controller may execute a read status command to read or obtain the flag register signal. Reading or obtaining the flag register signal may cause the controller to commence I/O operations in die 1 and die 2. In some embodiments, the controller may perform I/O operations after obtaining the flag register signal. Optionally, the controller may perform I/O operations after reading or obtaining the flag register signal at the status register. In some other embodiments, the controller may perform I/O operations only after obtaining the flag register signal. Alternatively, the controller may perform I/O operations only after reading or obtaining the flag register signal at the status register.

The controller may end the I/O operations at time t3. Thereafter, the controller may perform the high power portions of array operations in die 1 and die 2. After the high power portions of array operations are completed, the controller may generate and output a flag register signal at time t4. The flag register signal may cause the start of I/O operations in die 1 and die 2. The I/O operations may stop at time t5. Thus, in some embodiments, the high power portions of array operations may be performed when the I/O operations are not executed in die 1 and die 2, and the I/O operations may be performed when the high power portions of array operations are not executed in die 1 and die 2. As shown in FIG. 6, the high power portions occur between time t1-t2 and t3-t4 and the I/O operations occur between time t2-t3 and t4-t5. The I/O operations are performed outside the time periods of the high power portions of array operations. As the peak currents of the array operation and I/O operation are arranged in separate time frames, even when the peak currents of array operations of die 1 and die 2 are aligned, the total power consumption may still be maintained below an allowable level. The controller does not need to suspend array operations to avoid the alignment of peak currents of array operations in die 1 and die 2.

Figure 7:
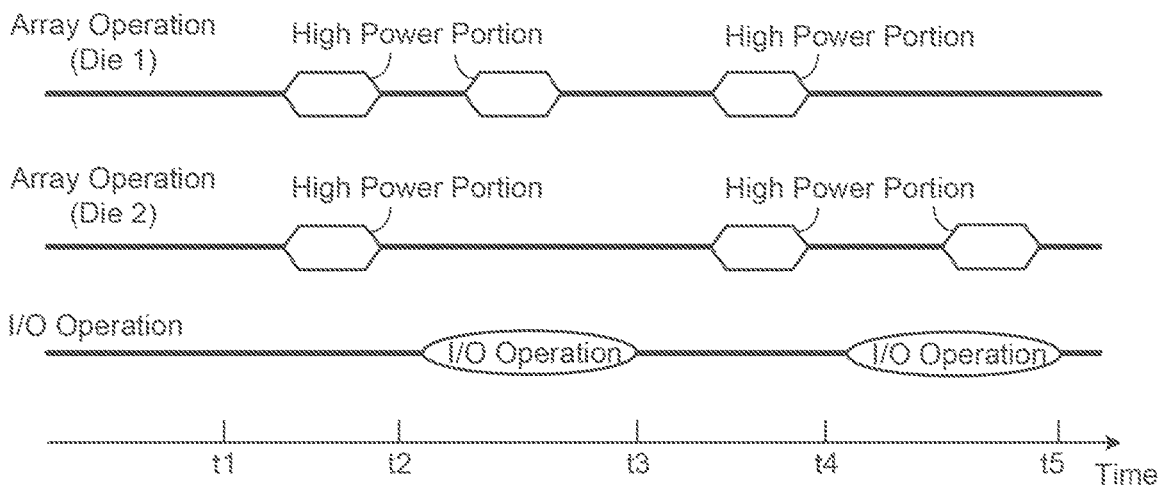
FIG. 7 illustrates a timing diagram of array and I/O operations of two dies according to various embodiments of the present disclosure.

FIG. 7 shows a timing diagram 700 of array and I/O operations in memory dies such as die 1 and die 2 according to various embodiments of the present disclosure. Assuming that a memory device includes die 1 with a first memory array and a first controller and die 2 with a second memory array and a second controller. The memory device may also include a status register (e.g., the status register 220 with respect to FIG. 2). The first and second controllers each may have a control circuit that is similar to the control circuit 212 with respect to FIG. 2 and arranged for implementing operations in die 1 and die 2, respectively. The first and second controllers are in communication with each other. In descriptions below with respect to FIG. 7, a "controller" as used herein may represent one of the first and second controllers or another controller of the memory device.

At time t1, no I/O operation is executed and the controller may perform array operations in die 1 and die 2. The controller may implement the high power portions of array operations in die 1 and die 2, respectively. The two high power portions of array operations in die 1 and die 2 may overlap entirely. In some cases, the two high power portions of array operations may overlap partially. Around time t2, the controller may end the high power portions of array operations in die 1 and die 2, respectively. After the high power portions are ended, the controller may output a flag register signal. Further, the controller may send the flag register signal to the status register. The controller may execute a read status command to read or obtain the flag register signal. Reading or obtaining the flag register signal may cause the controller to commence I/O operations in die 1 and die 2. In some embodiments, when the I/O operations are performed in die 1 and die 2, the controller may execute a high power portion of a single array operation in a die (e.g., die 1). As the I/O operations consumes lower power compared to the high power portion, the addition of the peak currents of one array operation and the I/O operations may be maintained below the maximum level.

The controller may end the I/O operations at time t3 and end the high power portion of array operation in die 1 before or at time t3. Thereafter, the controller may perform high power portions of array operations in die 1 and die 2 concurrently. After the high power portions of array operations are completed, the controller may generate a flag register signal at time t4. The flag register signal causes the start of I/O operations in die 1 and die 2. The I/O operations may stop at time t5. Between time t4 and t5, the control may perform a high power portion of an array operation in one die (e.g., die 2). The high power portion operated in die 2 and the I/O operations conducted in die 1 and die 2 may be arranged concurrently.

Thus, in some embodiments, the high power portions of array operations in both die 1 and die 2 may be performed when the I/O operations are not executed, and the I/O operations may be performed when the high power portions of array operation are not executed in the memory dies. Optionally, the I/O operations may also be performed when the high power portion is executed only in one memory die. As shown in FIG. 7, the high power portions in both dies occur between time t1-t2 and t3-t4 and the I/O operations and a high power portion of the array operation in one memory die occur between time t2-t3 and t4-t5. The I/O operations are performed outside the time periods when the high power portions of array operations are performed in more than one memory die. As the peak currents of the array operations in both dies and the peak currents of the I/O operations in both dies are arranged in separate time frames, even when the peak currents of array operations of die 1 and die 2 are aligned, the total power consumption may still be maintained below an allowable level. The controller does not need to suspend array operations to avoid the alignment of peak currents of array operations in die 1 and die 2.

Figure 8:
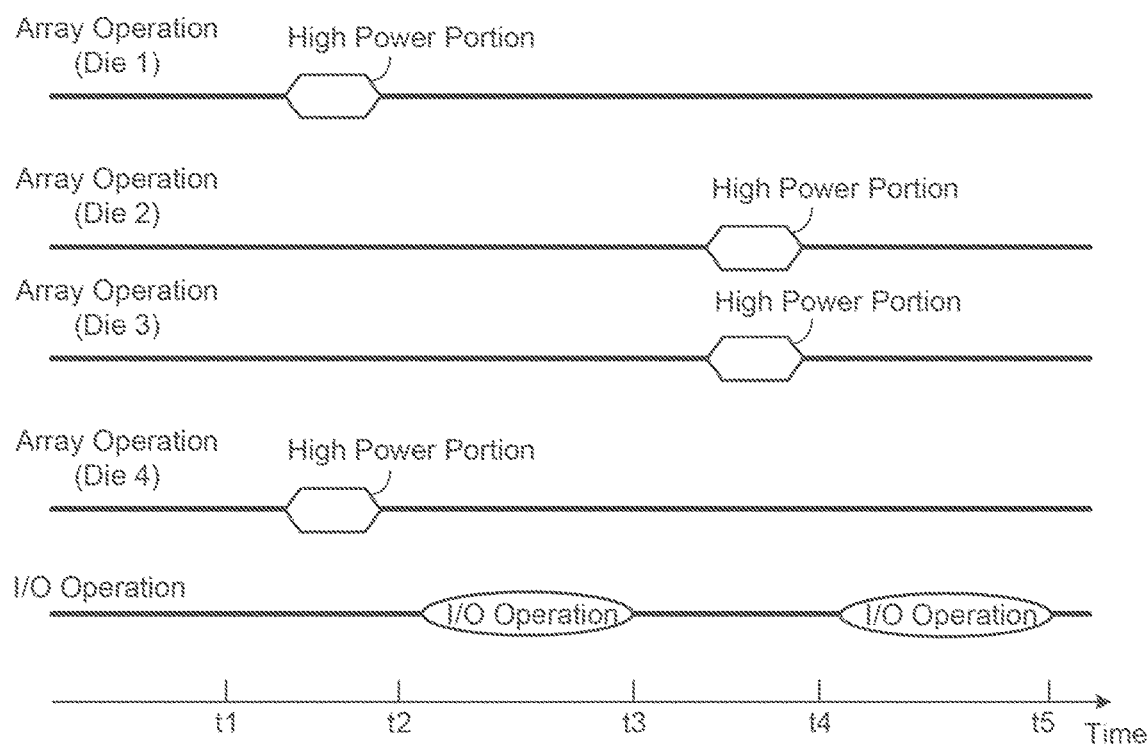
FIG. 8 illustrates a timing diagram of array and I/O operations of four dies according to various embodiments of the present disclosure.

FIG. 8 shows a timing diagram 800 of array and I/O operations of four dies according to various embodiments of the present disclosure. Assuming that a memory device includes four memory dies (e.g., dies 1-4) and each memory die has a memory array and a controller. The memory device may also include a status register (e.g., the status register 220 with respect to FIG. 2). The controllers of the dies are in communication with each other. In descriptions below with respect to FIG. 8, a "controller" as used herein may represent one or more of the controllers or another controller of the memory device. In some cases, the high power portions of array operations of the four dies may be performed concurrently. In descriptions below, however, the high power portions of array operations are executed in only one or two dies at a time, assuming that the maximum power level may be maintained when the high power portions are executed in no more than two dies. As such, the quantity of memory dies involved in high power portions of array operations is below three at a time in the following descriptions.

At time t1, the controller may perform high power portions of array operations in, e.g., die 1 and die 4. The two high power portions of array operations may overlap entirely. In some cases, the two high power portions of array operations may overlap partially. Around time t2, the controller may end the high power portions of array operations in die 1 and die 4. After the high power portions are ended, the controller may output a flag register signal. Further, the controller may send the flag register signal to the status register. The controller may execute a read status command to read or obtain the flag register signal at the status register. Reading or obtaining the flag register signal may cause the controller to commence I/O operations in one or more of dies 1-4.

The controller may terminate the I/O operations in dies 1-4 at time t3. Further, the controller may perform the high power portions of array operations in two dies (e.g., die 2 and die 3). After the high power portions of array operations in die 2 and die 3 are completed, the controller may output a flag register signal at time t4. The flag register signal may cause the start of I/O operations in dies 1-4. The I/O operations in dies 1-4 may be concluded at time t5. As shown in FIG. 8, the high power portions in two of the dies occur between time t1-t2 and t3-t4 and the I/O operations in the four dies occur between time t2-t3 and t4-t5. As the peak currents of the array operations in two dies and the I/O operations are arranged in separate time frames, even when the peak currents of array operations of two dies are aligned, the total power consumption may still be maintained below an allowable level. The controller does not need to suspend array operations to avoid the alignment of peak currents of array operations in two dies.

Figure 9:
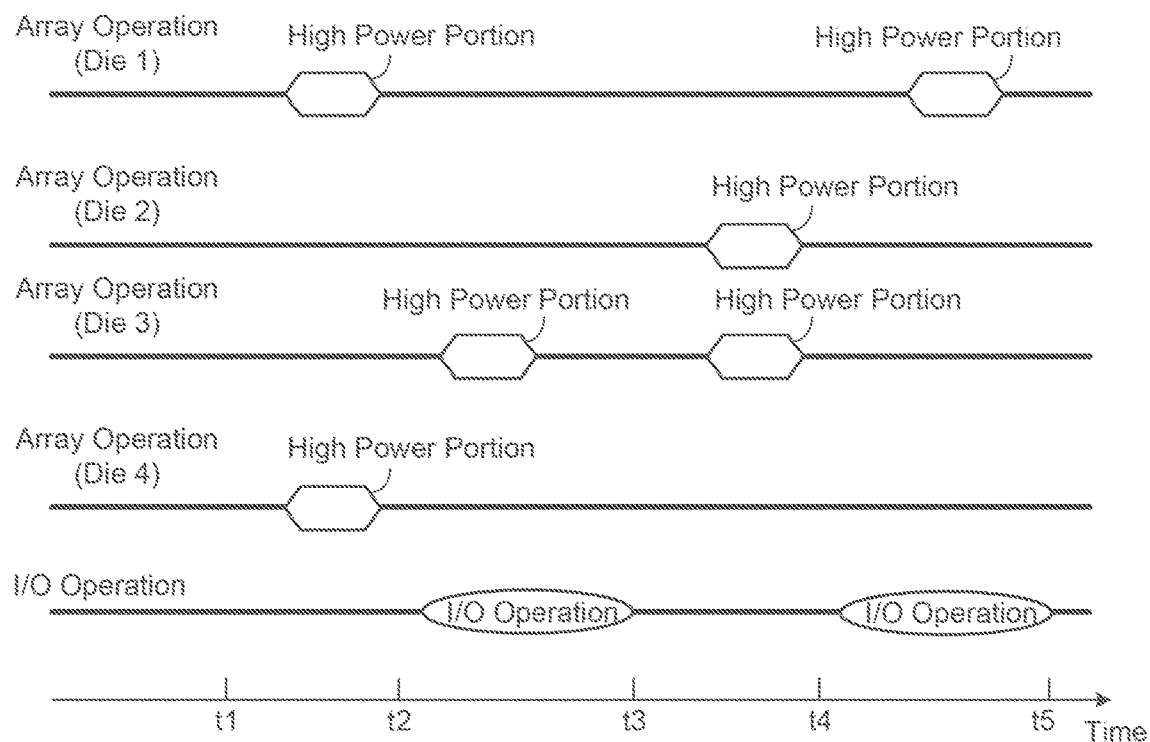
FIG. 9 illustrates a timing diagram of array and I/O operations of four dies according to various embodiments of the present disclosure.

FIG. 9 shows a timing diagram 900 of array and I/O operations of four dies according to various embodiments of the present disclosure. Assuming that a memory device includes four memory dies (e.g., dies 1-4) and each memory die has a memory array and a controller. The memory device may also include a status register (e.g., the status register 220 with respect to FIG. 2). The controllers of the dies are in communication with each other. In descriptions below with respect to FIG. 9, a "controller" as used herein may represent one or more of the controllers or another controller of the memory device. Further, the high power portions of array operations are executed in one or two dies only at a time, assuming that the maximum power level may be maintained when the high power portions are executed in no more than two dies.

At time t1, the controller may perform high power portions of array operations in, e.g., die 1 and die 4. Around time t2, the controller may end the high power portions of array operations in die 1 and die 4. After the high power portions are ended, the controller may output a flag register signal. Further, the controller may send the flag register signal to the status register. The controller may execute a read status command to read or obtain the flag register signal at the status register. In response to reading or obtaining the flag register signal, the controller may commence I/O operations in dies 1-4. When performing the I/O operations, the controller may also execute a high power portion of the array operation in one of the dies (e.g., die 3).

The controller may end the I/O operations in dies 1-4 at time t3 and end the high power portion in die 3 before or at time t3. Further, the controller may perform the high power portions of array operations in two dies (e.g., die 2 and die 3) after time t3. After the high power portions of array operations in die 2 and die 3 are completed, the controller may output a flag register signal at time t4. The flag register signal may cause the start of I/O operations in dies 1-4. When performing the I/O operations, the controller may also execute a high power portion of the array operation in one of the dies (e.g., die 1). The I/O operations in dies 1-4 may be concluded at time t5 and the high power portion may be ended before time t5. As the peak currents of the array operations in two dies and the I/O operations are arranged in separate time frames, the controller does not need to suspend array operations to avoid the alignment of peak currents of array operations in the two dies. The methods described above with respective to FIGS. 8-9 apply to scenarios when the memory device has more than four memory dies, e.g., eight memory dies.

Figure 10:
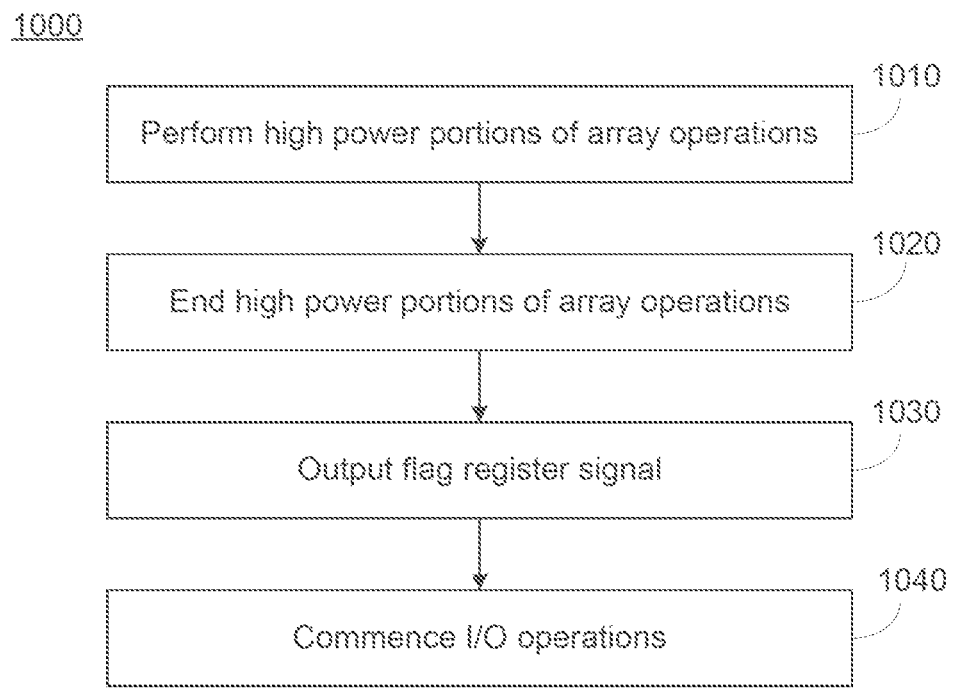
FIGS. 10-11 illustrate schematic flow charts showing methods of array and I/O operations according to various aspects of the present disclosure.

FIG. 10 shows a schematic flow chart 1000 for methods of array and I/O operations according to embodiments of the present disclosure. Assuming that a memory device includes a memory die (e.g., die 1) with a first memory array and a first controller and another memory die (e.g., die 2) with a second memory array and a second controller. The memory device may also include a status register. In descriptions below with respect to FIG. 10, a "controller" as used herein may represent one of or both the first and second controllers or another controller of the memory device.

At 1010, the controller may perform array operations in die 1 and die 2. The controller may start high power portions of array operations in die 1 and die 2, respectively. At 1020, the controller may end the high power portions of array operations. After the high power portions are ended, the controller may output a flag register signal at 1030. In some cases, ending of the high power portions may cause the controller to output a flag register signal. Optionally, the controller may send the flag register signal to the status register. The controller may execute a read status command to read or obtain the flag register signal at the status register. At 1040, reading or obtaining the flag register signal may cause the controller to commence I/O operations in die 1 and die 2. In some embodiments, the controller may perform I/O operations after the flag register signal is generated. Optionally, the controller may perform I/O operations after reading or obtaining the flag register signal at the status register.

Figure 11:
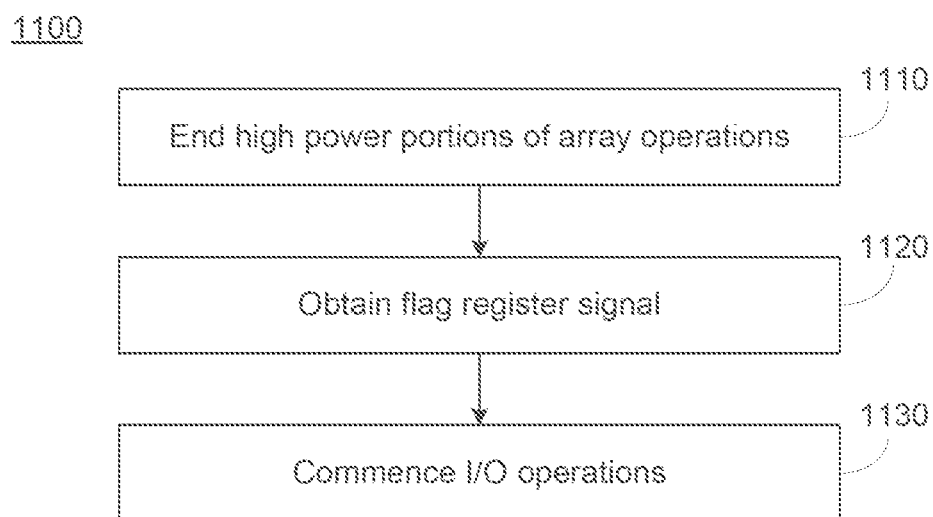

FIG. 11 shows a schematic flow chart 1100 illustrating methods of array and I/O operations according to embodiments of the present disclosure. Assuming that a memory device includes a first memory die (e.g., die 1) with a first memory array and a first controller and a second memory die (e.g., die 2) with a second memory array and a second controller. The memory device may also include a status register. In descriptions below with respect to FIG. 11, a "controller" as used herein may represent one of or both the first and second controllers or another controller of the memory device.

The controller may perform array operations in die 1 and die 2 in a first time period. During the first time period, the I/O operation in die 1 and die 2 are not executed. The controller may carry out the high power portions of array operations in die 1 and die 2 without suspending any array operations. At 1110, the controller may end the high power portions of array operations in a second time period. After the high power portions in both dies are ended, the controller may generate a flag register signal. For example, the controller may monitor array operations in die 1 and die 2. When detecting that the high power portions are ended in both dies, the controller may produce and output a flag register signal. The flag register signal may be sent to the status register. At 1120, the controller detects or obtains the flag register signal. For example, the controller may obtain the flag register signal directly after it is generated. Alternatively, the controller may execute a read status command to read or obtain the flag register signal at the status register. After receiving or detecting the flag register signal, the controller may commence I/O operations in die 1 and die 2 at 1130 in a third time period. In some embodiments, the controller may perform I/O operations after the flag register signal is generated.

Hence, the high power portions of array operations in die 1 and die 2 and the I/O operations in die 1 and die 2 are performed in separate time periods. Even when the peak currents of array operations of die 1 and die 2 are aligned, the total power consumption may still be under control. As such, the controller does not need to pause or stop any array operation to avoid exceeding the maximum power level. The performance of the memory device may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for a memory device having a plurality of memory dies, comprising:
    performing a plurality of high power portions of array operations in the plurality of memory dies without determining whether to suspend any high power portion of the array operations to avoid an alignment of peak currents of the array operations in the plurality of memory dies;
    ending the plurality of high power portions of the array operations in the plurality of memory dies;
    generating a register signal after ending the plurality of high power portions; and
    in response to obtaining the register signal, commencing one or more input/output (I/O) operations in the plurality of memory dies outside a time period of the plurality of high power portions performed in the plurality of memory dies.

2. The method according to claim 1, further comprising:
    transmitting the register signal to a status register after generating the register signal.

3. The method according to claim 2, further comprising:
    performing a command to read the register signal at the status register to obtain the register signal.

4. The method according to claim 1, wherein:
    the plurality of high power portions are performed when the one or more I/O operations are not executed.

5. The method according to claim 4, wherein:
    the plurality of high power portions are performed only when the one or more I/O operations are not executed.

6. The method according to claim 1, wherein:
    the one or more I/O operations are performed when at least one of the plurality of high power portions is not executed or the one or more I/O operations are performed only when the plurality of high power portions are not executed.

7. The method according to claim 1, wherein:
    a peak current is beyond a predetermined value over the time period in one of the plurality of high power portions of the array operations.

8. The method according to claim 1, further comprising:
    performing one of the plurality of high power portions when the one or more I/O operations are executed.

9. A memory device, comprising:
    a plurality of memory dies each including one or more memory arrays; and
    a controller, wherein the controller is configured to:
    generate a register signal when a plurality of high power portions in the plurality of memory dies are ended without determining whether to suspend any high power portion of array operations to avoid an alignment of peak currents of the array operations in the plurality of memory dies; and
    in response to obtaining the register signal, commence one or more input/output (I/O) operations in the plurality of memory dies outside a time period of the plurality of high power portions performed in the plurality of memory dies.

10. The memory device according to claim 9, further comprising:
    a status register for storing the register signal;
    wherein the controller is further configured to transmit the register signal to the status register after generating the register signal.

11. The memory device according to claim 10, wherein the controller is further configured to:
    perform a command to read the register signal at the status register to obtain the register signal.

12. The memory device according to claim 9, wherein the controller is further configured to:
    perform the plurality of high power portions when the one or more I/O operations are not executed.

13. The memory device according to claim 12, wherein the controller is further configured to:
    perform the plurality of high power portions only when the one or more I/O operations are not executed.

14. The memory device according to claim 9, wherein the controller is further configured to:
    perform the one or more I/O operations when at least one of the plurality of high power portions is not executed.

15. The memory device according to claim 14, wherein the controller is further configured to:
    perform the one or more I/O operations only when the plurality of high power portions are not executed.

16. The memory device according to claim 9, wherein the controller is further configured to:
    perform one of the plurality of high power portions when the one or more I/O operations are executed.

17. The memory device according to claim 9, wherein:
    the controller and the one or more memory arrays are disposed in one of the plurality of memory dies.

18. The memory device according to claim 9, wherein:
    a peak current is beyond a predetermined value over the time period in one of the plurality of high power portions.

19. The memory device according to claim 9, wherein:
    the plurality of memory dies include a plurality of three-dimensional (3D) NAND Flash memory dies.

20. A memory die, which is selected from a plurality of memory dies that are power managed together, comprising:
    one or more memory arrays;
    an input/output (I/O) interface;
    a status register for storing a register signal; and
    a controller, wherein the controller is configured to:
    generate the register signal when a plurality of high power portions in the plurality of memory dies are ended without determining whether to suspend any high power portion of array operations to avoid an alignment of peak currents of the array operations in the plurality of memory dies;

transmit the register signal to the status register after generating the register signal; and in response to obtaining the register signal, commence an I/O operation in the memory die outside a time period of the plurality of high power portions performed in the plurality of memory dies.

\* \* \* \* \*